United States Patent [19]

Wisseroth et al.

[11] Patent Number: 4,860,277

[45] Date of Patent: Aug. 22, 1989

[54] MEDIUM AND METHOD FOR IRREVERSIBLE STORAGE OF INFORMATION

[75] Inventors: Karl Wisseroth, Ludwigshafen; Richard Scholl, Gruenstadt, both of Fed. Rep. of Germany

[73] Assignee: BASF Aktiengesellschaft, Ludwigshafen, Fed. Rep. of Germany

[21] Appl. No.: 14,547

[22] Filed: Feb. 13, 1987

[30] Foreign Application Priority Data

Feb. 14, 1986 [DE] Fed. Rep. of Germany ....... 3604568

[51] Int. Cl.$^4$ .......................... G01B 1/02; G01C 13/02
[52] U.S. Cl. ..................................... 369/126; 219/216; 204/2; 346/76 R; 346/76 PH; 346/153.1; 365/153; 369/151; 369/276; 369/288
[58] Field of Search ............. 346/76 R, 76 PH, 135.1, 346/165; 369/126, 276, 283, 288, 151; 365/100, 107, 118, 148, 151, 153; 219/216; 400/120; 204/2; 429/213; 252/510, 511

[56] References Cited

U.S. PATENT DOCUMENTS

| | | | |
|---|---|---|---|
| 2,698,928 | 1/1955 | Pulvari | 369/126 |
| 3,179,944 | 4/1965 | Dickens | 369/126 |
| 3,872,318 | 3/1975 | Murayama | 365/153 |
| 4,042,936 | 8/1977 | Yoshikawa | 346/165 |
| 4,121,260 | 10/1978 | Dye et al. | 346/165 |
| 4,317,139 | 2/1982 | Nelson | 346/165 |
| 4,375,427 | 3/1983 | Miller | 429/213 |
| 4,559,284 | 12/1985 | Nishimura | 429/213 |

OTHER PUBLICATIONS

Scientific American, Oct. 1986, vol. 255, No. 4, p. 190.

*Primary Examiner*—Steven L. Stephan
*Attorney, Agent, or Firm*—Keil & Weinkauf

[57] ABSTRACT

A medium for irreversible information storage by locally changing the electrical conductivity of a carrier whose discrete areas of electrical conductivity have been produced by means of polymeric systems which contain conjugated double bonds and are formed by a field-chemical reaction, and a method for carrying out this information storage.

5 Claims, 7 Drawing Sheets

MEDIUM AND METHOD FOR IRREVERSIBLE STORAGE OF INFORMATION

The present invention relates to a medium for irreversible information storage by locally changing the electrical conductivity of a carrier whose discrete areas of electrical conductivity have been produced by a field-chemical reaction, and a method for carrying out this information storage.

It is known that information can be stored on magnetic recording media by producing discrete areas of different magnetization in the magnetizable layers. For this purpose, the magnetizable layers may consist of either ferrimagnetic or ferromagnetic particles homogeneously dispersed in organic binders, or directly of a homogeneous layer of a ferrimagnetic or ferromagnetic material. The first-mentioned magnetic recording media have long been known and are used for a variety of purposes in the audio, video and data sectors. Their production has been substantially optimized. The limits to their use are probably determined by the maximum possible storage density. In order to increase this, homogeneous layers of ferromagnetic materials are increasingly being investigated and are already in use for data and video recording. However, although there are advantages with regard to the magnetic properties and the storage technique, there are still problems with the mechanical stability of these media.

In order to overcome the fundamental limits of the storage density in magnetic recording media, optical information storage has already been considered. This is based on the production of marks on a medium by the action of light. Irreversible optical storage in which a laser beam is used as a light source to produce unalterable marks on a generally disk-shaped medium is already at the stage of technical implementation. As a result of irradiation, an optical property of the recording layer, mainly the reflectivity of absorption, changes. The mark is a burned-in hole in the recording layer. Reading is likewise carried out by means of a laser, but a substantially lower laser energy is chosen. Known media are homogeneous two-dimensional particulate and three-dimensional particulate layers. A wide variety of materials are used for this purpose, generally specific semi-metals or metals. Homogeneous metal layers have the disadvantages that they have to be very thin because of the low thermal conductivity required, and this makes it very difficult to produce defect-free films without pores and holes. The particulate layers have the disadvantage that both the production of the metal particles and uniform incorporation of the particles into a matrix present problems.

It is an object of the present invention to provide a medium for irreversible information storage, the said medium on the one hand permitting a further increase in the storage density beyond the known level into the molecular region and, on the other hand, being capable of being written on and read again by simple means. It is a further object of the present invention to provide a method which permits this type of information storage.

We have found that this object can be achieved and that a medium for irreversible information storage can be obtained in a simple manner by locally changing the electrical conductivity of a carrier, if the discrete areas of electrical conductivity of the carrier are produced by means of the polymeric systems which contain conjugated double bonds and are formed by a field-chemical reaction.

The present invention furthermore relates to a method for information storage by means of a field-chemical reaction, wherein substances applied on a sheet-like or film-like carrier are converted, between the needle-like tips of two electrodes by the action of at least local electric fields having strengths greater than $10^6$ volt/cm, to polymeric systems which contain conjugated double bonds and possess electrical conductivity, with the proviso that the tips of the electrodes are arranged a distance apart which is no less than the thickness of the carrier, and the two electrodes are connected in series via one or more capacitors to a high voltage supply of from 1,000 to 100,000 volt.

It is known that chemical reactions can be carried out in sufficiently strong electrical fields, in general from $10^7$ to $10^9$ volt/cm (e.g. K. Wisseroth, Nachrichten aus Chemie, Technik und Labor 27 (1979), 327-328 and Chemiker Zeitung 108 (1984), 131-135). This type of reaction is referred to as a field-chemical reaction. The high electric field accelerate the reaction catalytically.

The novel media carry the stored information, on or in the carrier, in the form of the areas of different electrical conductivity which are associated with the individual information units. These areas are produced by the novel method.

The formation of polymeric systems containing conjugated double bonds has proven suitable for a chemical reaction for information storage in an electric field. For example, particularly suitable substances are polyanilines, polyindamines, polymeric azo structures and in particular the polyacetylenes or cuprenes. These systems are also known as organic metals in view of the high mobility of the electrons forming the conjugated double bonds, which leads to metal-like electrical conductivity along the molecular chain. A matrix covered with the polymers mentioned first as examples generally becomes electrically conductive only after additional doping with other substances, eg. aniline or dioxane. On the other hand, the polyacetylenes possess more or less pronounced conductivity, depending on the intensity of the applied field, directly after production by polymerization of monomeric acetylene or its derivatives in an electric field. The products produced in this manner do not deteriorate at all with time, especially in respect of their conductivity, even after prolonged contact with the atmosphere.

The reactions mentioned can be carried out in the gas phase, for example with acetylene, in the liquid phase, for example with phenylacetylene, or in the solid phase, for example with diphenylacetylene. For this purpose, the thin carrier, eg. a paper matrix about 100 $\mu$m thick, a tape or disk of various plastic films, such as a polyolefin, a nylon or in particular polyvinyl chloride, is impregnated or brought into contact with the monomer to be reacted and is passed between the tips of the write electrodes, between which the field strengths required for the field-chemical reaction are generated in a sequence corresponding to the information to be written. The track width of the recorded information is essentially determined by the tip diameter of the write electrodes. Small track widths, in principle down to the Ångströom range, can be obtained by using fine tungsten tips, as can be produced, for example, by the Müller method for use in field electron microscopes by etching in molten alkali.

When tips having a radius of curvature of, for example, 0.01 millimeter are charged to a potential of, for example, 10,000 volt, a field strength of $$F = \frac{U}{r} = \frac{10^4}{10^{-3}} = 10^7 \text{ Volt/cm}$$

is obtained directly in front of the tips, ie. a value which is sufficient to trigger the stated chemical reactions in a field. In view of the small tip spacing, the potential usually breaks down rapidly with formation of a discharge streamer, ie. a small plasma column. However, according to plasma chemistry, many chemical reactions are accelerated in plasma too. In order as far as possible to suppress this breakdown of the potential, and thus also substantially to restrict the electric output of the discharge, in an advantageous embodiment of the novel method the discharge electrodes are connected to the high voltage source via one or more capacitors having a sufficiently low capacitance. FIG. 1 shows the basic scheme of such an arrangement. The voltage supply provided can be from about 1,000 to 100,000 volt. The graphs shown in FIGS. 2 and 3 give the modulation of electrode charging for the input of, for example, a sequence of spoken sounds, for an a.c. or d.c. voltage. In these graphs, 1 and 2 denote the beginning and end of the speech sequence.

Under otherwise constant conditions, there is a characteristic relationship between the reaction-producing field strength F of its associated voltage U and the conductivity proportion to the reaction, or a current i used to measure it. In analogy to the electron tube or transistor characteristic, this characteristic relationship is designated as the converted characteristic. FIG. 4 shows this relationship, by way of example, for polyaniline formation after doping with dioxane. The steepness on this characteristic in the middle region appears to be particularly important with regard to the recording of information pulses, which is accompanied by transformation. Similar relationships are also observed, inter alia, in the polymerization of acetylene and its derivatives to cuprenes.

The intensity of the written information can be influenced by both the predeterminable voltage, by regulating the voltage supply, and by varying the capacitances of the write electrodes. The last-mentioned effect also determines the distinctness of a continuous line, since, as the capacitance increases, the normally cohesive line is resolved into a discontinuous record in the form of a string of beads.

The Example which follows illustrates the invention.

EXAMPLE

FIG. 5 shows an arrangement for carrying out the novel method. The pair of write electrodes 3 can be charged to voltages of from about 1,000 to about 40,000 volt from a high voltage transformer, via the two capacitors 1 and 2, each of which has a capacitance of about $10^{-11}$ farad. The capacitor and electrode form a combined unit in each case, the electrode being inserted in a glass capillary tube sealed on one side by fusion, and an outer sliding metal sleeve permitting the capacitance to be easily adjusted (FIG. 6). The electrode tips are pressed lightly from both sides against the surfaces of a paper belt 4 by means of elastic spring pressure, the said belt being fed continuously between the two electrodes. A modulation apparatus 5, which in the present case is a simple interrupter, makes it possible to close the high voltage circuit in a predeterminable manner. The matrix used is millimeter paper in the form of a belt which is 9 mm wide and about 5 mm long and has been impregnated with a solution of tolane and ethanol, which is about 30% strength by weight, and then dried.

Prolonged actuation of the interrupter 5 results directly in a sharp blackish brown line on the belt running through. On the other hand, activation for short periods gives very sharp and extremely fine points (diameter less than 0.1 mm). The upper and lower surfaces of the belt are colored in virtually the same way. The examination under the microscope shows a uniform colored zone which is locally relatively sharply defined.

When the conductivity is measured by determining the current flow at right angles to the surface of the paper, fluctuating values are obtained in the colored zones of the paper; depending on the strength of the applied field, these values range from a conductivity of zero to true metallic short-circuit, while the paper which has not been colored by reaction products acts as an insulator. FIG. 7 shows the relationship between effective field strength, defined by the input voltage of the transformer U in volt, and the conductivity, defined by the current flow i in $\mu A$.

Figure 1:
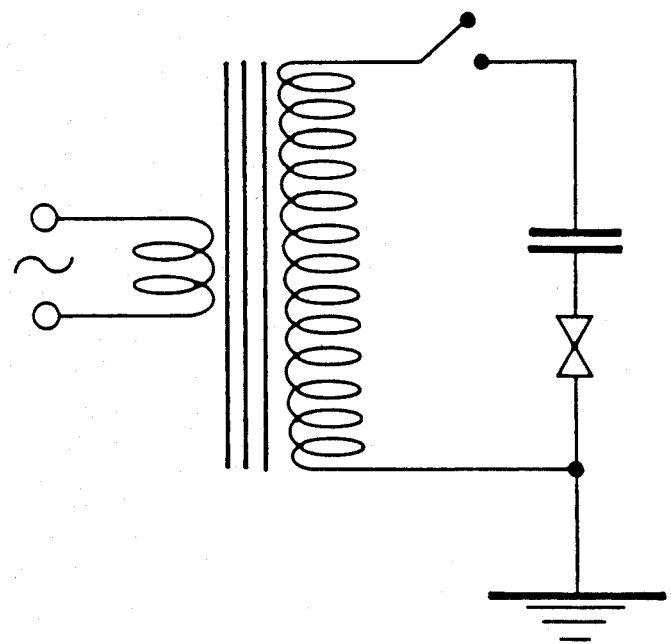
FIG. 1 shows the basic scheme for the electrical supply to the discharge electrodes used in the information storage process.
Figure 2:
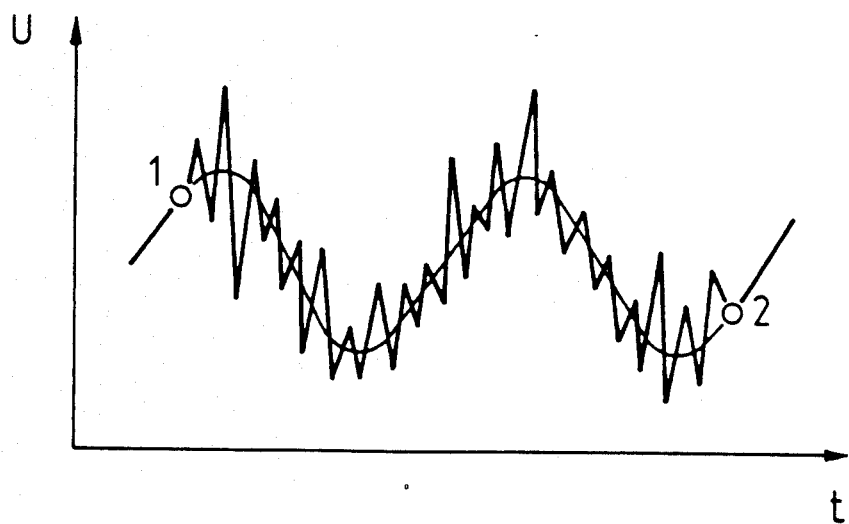
FIGS. 2 and 3 show the modulation of electrode charging for sound input with alternating and direct current.
Figure 3:
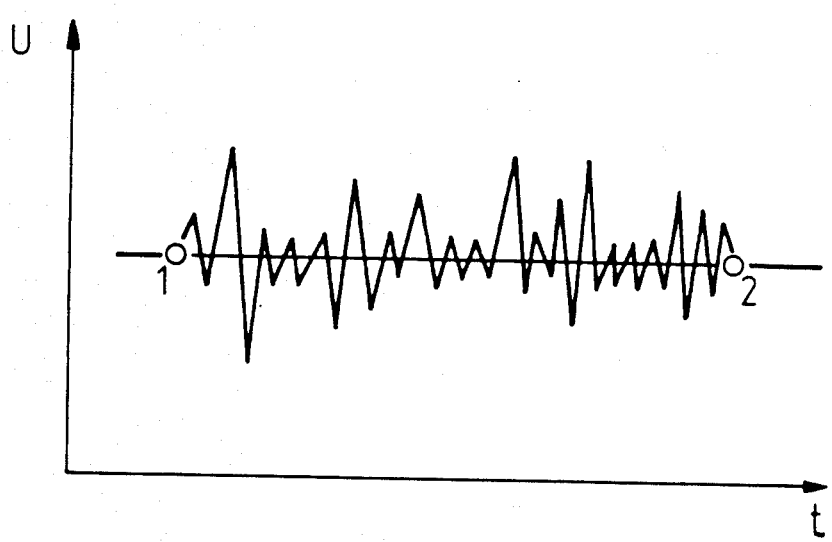
Figure 4:
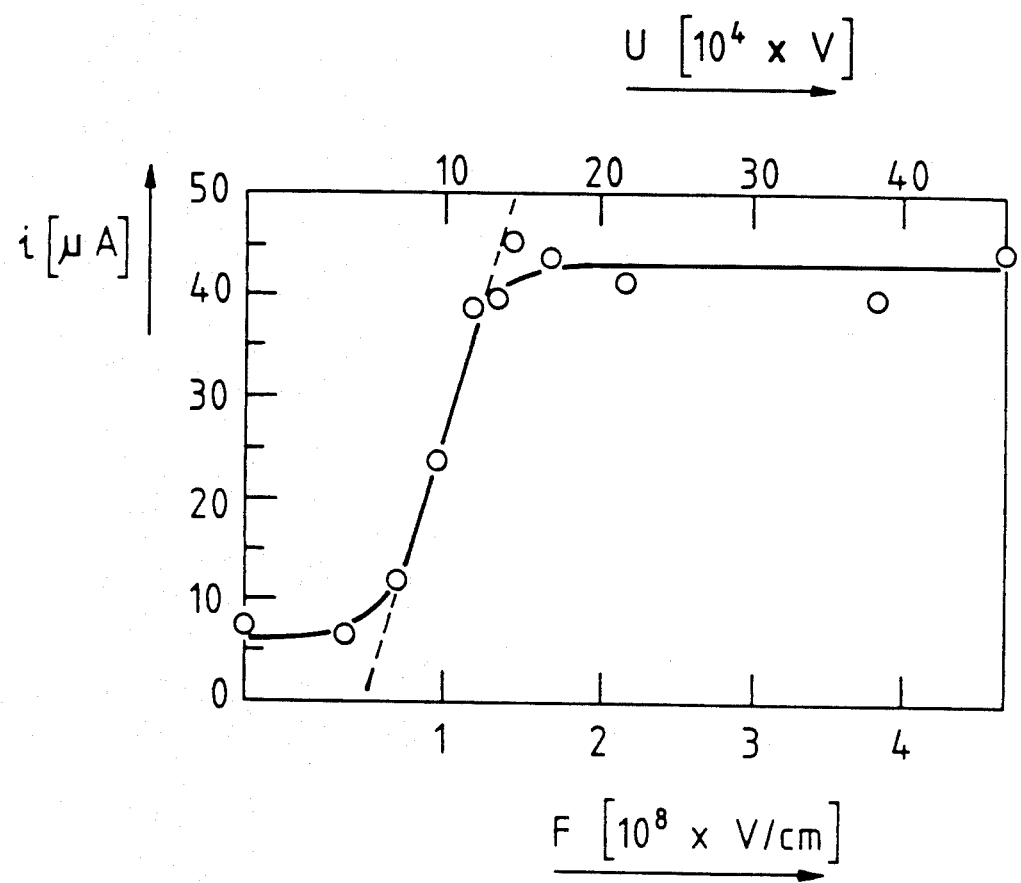
FIG. 4 shows the relationship between the reaction-producing field strength, F, its associated voltage, U, and the current, i, used to measure it.
Figure 5:
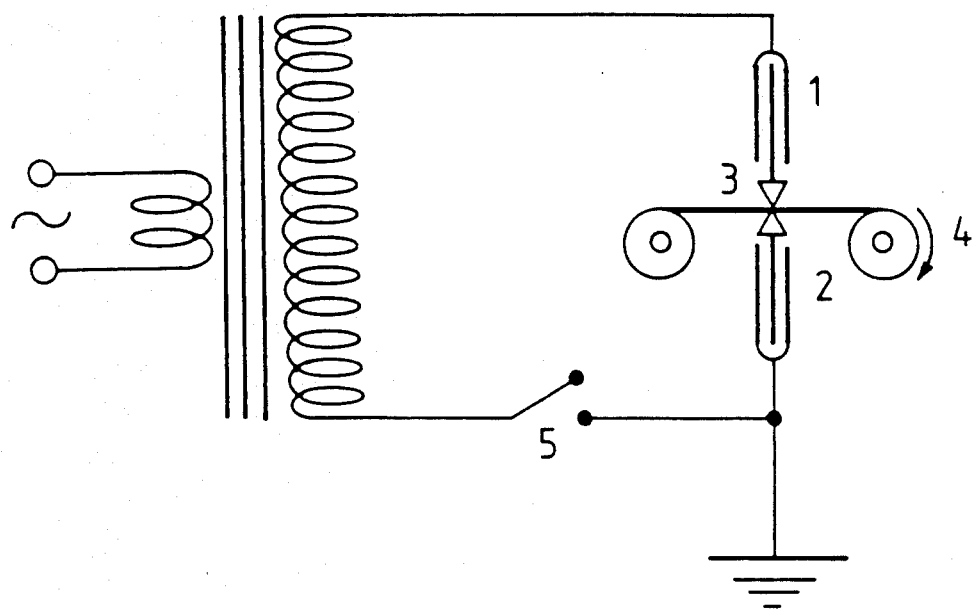
FIG. 5 shows an arrangement for effecting irreversible information storage.
Figure 6:
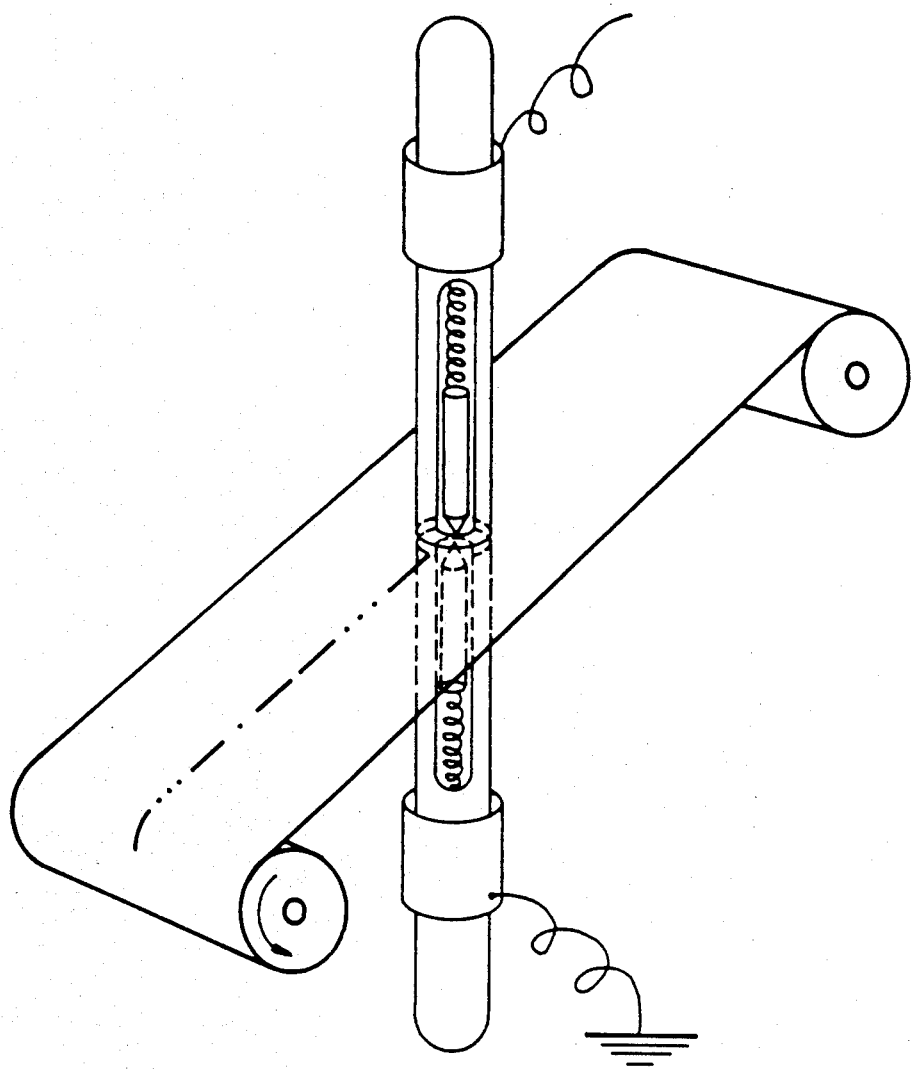
FIG. 6 shows an embodiment of the capacitor and electrode combined units.
Figure 7:
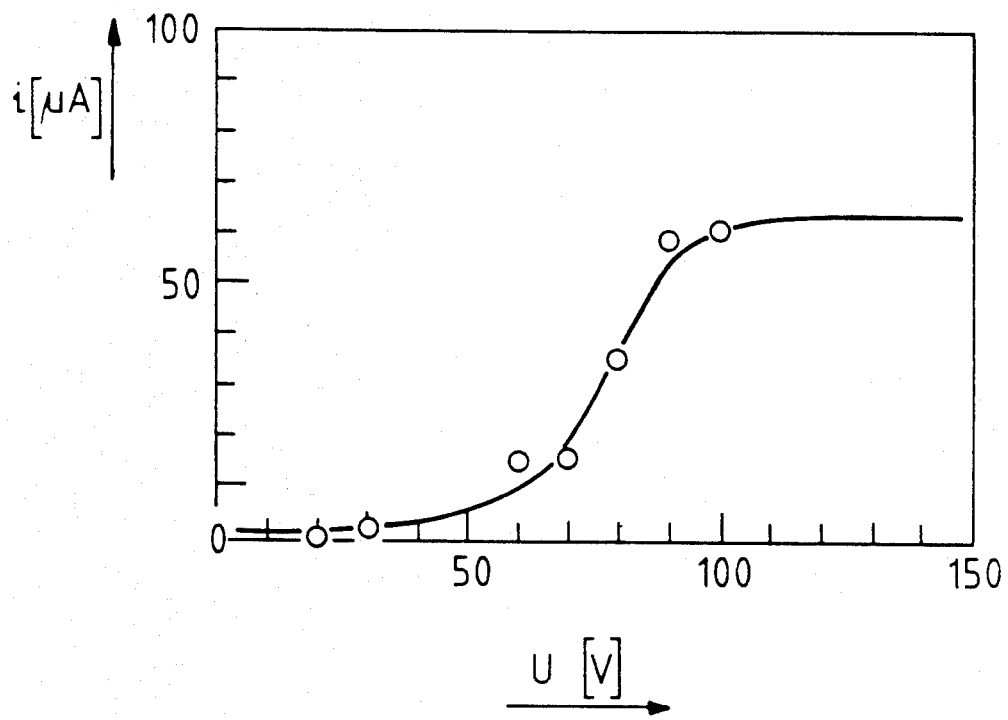
FIG. 7 shows the relationship between the effective field strength, U, and the current, i, which defines the conductivity.

We claim:

1. A medium for irreversible information storage which comprises a carrier and substances, which are convertible to organic polymers containing conjugated double bonds, applied to said carrier and having discrete areas of electrical conductivity, wherein said discrete areas of electrical conductivity are produced by organic polymers which contain conjugated double bonds and wherein said organic polymers are formed by a field-chemical reaction.

2. A medium for irreversible information storage as defined in claim 1, wherein the organic polymer containing conjugated double-bonds is a polyacetylene or a polymer of an acetylene derivative.

3. A method for irreversible information storage by means of a field-chemical reaction which comprises: applying substances, which are convertible to organic polymers containing conjugated double bonds, to a sheet-like or film-like carrier, and converting said substances to organic polymers, which contain conjugated double bonds and possess electrical conductivity, by means of a field-chemical reaction conducted by subjecting said carrier having said substance applied thereto to the action of at least local electric fields having strengths greater than $10^6$ volt/cm which electric fields are formed between the needle-like tips of two electrodes, with the proviso that the tips of the electrodes are arranged a distance apart which is no less than the thickness of the carrier, and the two electrodes are connected in series via one or more capacitors to a high voltage supply of from 1,000 to 100,000 volts.

4. The method of claim 3, wherein the substances to be reacted are present in gaseous, liquid or solid form between the electrode tips defining the electric field, and in direct contact with the carrier.

5. The method of claim 3, wherein the field-chemical reaction gives an organic polymer containing conjugated double bonds.

* * * * *